United States Patent
Shida et al.

[11] Patent Number: 5,757,198
[45] Date of Patent: May 26, 1998

[54] METHOD AND APPARATUS FOR DETECTING AN IC DEFECT USING CHARGED PARTICLE BEAM

[75] Inventors: Soichi Shida, Ohra-gun; Hiroshi Kawamoto, Ohsato-gun; Hironobu Niijima, Ohra-gun, all of Japan

[73] Assignee: Advantest Corporation, Tokyo, Japan

[21] Appl. No.: 641,358

[22] Filed: Apr. 30, 1996

Related U.S. Application Data

[62] Division of Ser. No. 503,003, Jul. 17, 1995, abandoned.

[30] Foreign Application Priority Data

Jul. 18, 1994 [JP] Japan .................................. 6-165149

[51] Int. Cl.$^6$ ................................................ G01R 31/28
[52] U.S. Cl. ................................... 324/751; 324/96
[58] Field of Search ....................... 324/96, 750, 751, 324/501, 719, 73.1, 158.1, 500, 537; 382/8; 348/125, 126, 129; 356/364, 400; 250/310, 311

[56] References Cited

U.S. PATENT DOCUMENTS

| | | | |
|---|---|---|---|
| 4,358,732 | 11/1982 | Johnston et al. | 250/311 |
| 4,870,344 | 9/1989 | Stille | 324/751 |
| 5,164,666 | 11/1992 | Wolfgang et al. | 324/751 |
| 5,391,985 | 2/1995 | Henley | 324/158.1 |
| 5,528,156 | 6/1996 | Ueda et al. | 324/751 |

*Primary Examiner*—Vinh P. Nguyen
*Attorney, Agent, or Firm*—Staas & Halsey

[57] ABSTRACT

Test patterns are applied to an IC under test under a test pattern address by which the first fail is caused and under other test pattern addresses. A defect candidate area is moved to the position where a charged particle beam can scan the area and defect candidate wiring portions are specified. A potential data of the specified wiring is acquired for each of the test patterns and stored in a memory. This process is performed by sequentially stepping back the stop test pattern addresses. Then, a potential data of the specified wiring in the specified area is similarly acquired for non-defect IC. The respective potential data of the IC under test and the non-defect IC are compared to locate the mismatch test pattern address and wiring.

9 Claims, 13 Drawing Sheets

| POTENTIAL OUTPUT ADDRESS | HIGH | LOW |
|---|---|---|
| 1 | 1 | 1 0 |
| 2 | 1 0 0 | 1,000 |
| 3 | 1 0,0 0 0 | 1 0 0,0 0 0 |
| 4 | 1,0 0 0,0 0 0 | 1 0,0 0 0,0 0 0 |
| 5 | 1 0 0,0 0 0,0 0 0 | 1,0 0 0,0 0 0,0 0 0 |

METHOD AND APPARATUS FOR DETECTING AN IC DEFECT USING CHARGED PARTICLE BEAM

This application is a division of application Ser. No. 08/503,003, filed Jul. 17, 1995, now abandoned.

BACKGROUND OF THE INVENTION

The present invention relates to a method and an apparatus for detecting an IC defect by irradiating a charged particle bean to an IC which is not packaged, detecting amount of a secondary electron emission caused by the irradiation of a charged particle beam and obtaining data corresponding to the potential state of an irradiated spot.

An IC tester is used to test if an IC operates normally. Using an IC tester, an IC can be tested whether or not the IC operates normally for each pin basis. Therefore, in an IC which is determined as a defect IC, which pin does not work normally can be detected. However, a defect inside the package, i.e., which wiring portion of the semiconductor chip of the IC cannot be identified.

If a defect wiring portion can be located during a trial manufacturing stage prior to the mass production or in the case where the defect rate is unusually high even in the mass production stage, a cause of the defect can be identified, and a corrective action such as an improvement of the IC manufacturing processes can be taken.

In order to identify a defect portion in an IC, an IC defect analyzing apparatus utilizing a charged particle beam has been used. In this IC defect analyzing apparatus, a charged particle beam such as an electron beam is irradiated to a chip of an IC under test (DUT=Device Under Test hereinafter), and amount of a secondary electron emission from a wiring pattern portion formed on the IC chip is measured to know a potential of the wiring pattern. Also in the IC defect analyzing apparatus, the surface of the IC chip is scanned by a charged particle beam, and the potential state of the scanned area is acquired as a potential contrast image and displayed such that a low potential portion of the wiring pattern is displayed as white (amount of secondary electron emission is large) and a high potential portion is displayed as black (amount of secondary electron emission is small). Thus a defect portion can be identified from the potential state of a wiring pattern. Such a method for detecting an IC defect using a charged particle beam is shown in U.S. patent application Ser. No. 08/181,584 entitled "IC Analysis System and Electron Beam Probe System and Fault Isolation Method Therefor" filed on Jan. 14, 1994, or U.S. patent application Ser. No. 08/337,230 entitled "Method and Apparatus for Forming a Potential Distribution Image of Semiconductor Integrated Circuit" filed on Nov. 7, 1994, now U.S. Pat. No. 5,528,156.

In the identification of an IC defect, a potential contrast image is acquired first for a non-defect IC. Then, this potential contrast image is compared with a potential contrast image acquired for a defect IC by human eyes to locate the mismatch portion between the two potential contrast images. This process does not take much time if number of potential contrast image data is small. However, a recent IC is a large scale IC and contains many logic circuits in it. Since these logic circuits mutually relate each other and test patterns are applied to the IC sequentially to obtain the outputs in the usual process, it is necessary to examine which wiring portion of the IC is in failure at which test pattern address of a series of the test patterns. Moreover, an IC surface area is approximately 10 times (or more) of the maximum area where a charged particle beam can scan by deflection in a general charged particle beam tester. Thus, it is necessary to partition the entire IC surface into many segments for acquiring potential contrast image data for all the segments. Therefor, it is almost impossible to identify a defect wiring and the associated test pattern by performing the comparisons of the potential contrast images by human eyes in a test pattern basis for entire IC surface.

SUMMARY OF THE INVENTION

It is an object of the present invention to provide a method and an apparatus for detecting the mismatch test pattern address and the mismatch wiring portion almost automatically.

According to the method of the present invention, test patterns are applied to an IC under test (DUT) sequentially and the test pattern update is stopped at a stop test pattern address and then a charged particle beam is irradiated to the specified area of the DUT. Then a secondary electron emission is detected to acquire a potential contrast image data (first step). Then, the test patterns are applied to a second IC sequentially and the test pattern update is stopped at the stop test pattern address and then a charged particle beam is irradiated to the specified area of the second IC. Then, a secondary electron emission is detected to acquire a potential contrast image data (second step). Then, a potential data of a specified portion (wiring) in the specified area is acquired from the potential contrast image data of the DUT (first IC) (third step). Then, a potential data of the specified portion in the specified area is acquired from the potential contrast image data of the second IC (fourth step). Then the potential data acquired in the third step is compared with the potential data acquired in the fourth step (fifth step).

In the first and second steps, when the respective potential contrast image data are acquired, the stop test pattern address is stepped back to a predetermined stop test pattern address for acquiring both of the potential contrast image data (the first and second ICs) for each of the test pattern addresses. In the third and fourth step, both of the potential data of the specified wiring portions of the first and second ICs are acquired for each of the stop test pattern addresses. Then in the fifth step, the two potential data of the specified wiring portions are compared each other for each of the stop test pattern addresses.

In the case that a plurality of specified portions are specified, the comparison in the fifth step is performed for the same portion.

In the case that a plurality of areas are specified, every time potential contrast image data are acquired for predetermined test pattern addresses, potential contrast image data are acquired for another specified area by shifting the area sequentially.

In the fifth step, the two potential data are compared in binary values. Alternatively in the fifth step, the two potential data are compared as multi-value data.

According to the other view point of the method of the present invention, it is performed until the stop pattern address reaches a predetermined test pattern address by stepping back the stop test pattern addresses sequentially that the test patterns are sequentially applied to a DUT, the test pattern update is stopped at the stop test pattern address and a charged particle beam is irradiated to the specified area of a DUT to detect a secondary electron emission and to acquire a potential contrast image data (first step). Then, the test patterns are sequentially applied to a second IC, the test pattern update is stopped at the stop test pattern address and a charged particle beam is irradiated to the specified area of the second IC to detect a secondary electron emission and to acquire a potential contrast image data. This process is also performed until the stop pattern address reaches the predetermined test pattern address by stepping back the stop test pattern addresses sequentially (second step). Then, the potential data of the specified portion in the specified area is acquired from the respective potential contrast image data at each of the stop test pattern addresses for the DUT. (third step). Then, the potential data of the specified portion in the specified area is acquired from the respective potential contrast image data at each of the stop pattern addresses for the second IC (fourth step). Then, each of the potential data acquired in the third step is converted to a binary value (fifth step). Each of the potential data acquired in the fourth step is also converted to a binary value (sixth step). At this point, a conversion table (shown in FIG. 9) is used to proceed to the next step. In the conversion table, a numeric value is given in response to each of the logical values H and L (corresponding to the potential data) for each of the reference numbers corresponding to the test pattern addresses. The numeric value is selected so that a series of binary data is converted to a series of numeric value by using the conversion table, then the series of numeric value is accumulated, if even only one of the binary data is different, the accumulated value is also different.

Then, using this conversion table, a series of the numeric values corresponding to the series of the binary value potential data acquired in the fifth step is acquired for the DUT (seventh step). Similarly, a series of the numeric values corresponding to the series of the binary potential value acquired in sixth step is acquired for the second IC (eighth step). Then, the series of the numeric values acquired in the seventh step is accumulated (ninth step) and the series of the numeric values acquired in eighth step is accumulated (tenth step). Then, the accumulated value obtained in the ninth step is compared with the accumulated value obtained in the tenth step (eleventh step).

According to the further different view point of the present invention, the first step through the sixth step in the above other view point are performed similarly and then each of the binary valued potential data for each of the test patterns acquired in the fifth and sixth steps is displayed in a waveform for the pattern addresses as a common axis.

In either invention above, the potential contrast image data is acquired at each stop pattern address in the first step based on the two different operational conditions for a DUT. Then, a difference between the two potential contrast image data is generated and the difference image data is used as the potential contrast image data in the first step for the third and following steps. Also, the potential contrast image data is acquired at each stop pattern address in the second step based on the two different operational conditions for a second IC. Then, a difference between the two potential contrast image data is generated and the difference image data is used as the potential contrast image data in the second step for the fourth and following steps. The two operational conditions are a normal power supply voltage and an abnormal power supply voltage applied to the IC.

It is also possible to use the potential contrast image data in the first step for the third and following steps after accumulating those data for at least one area and to use the potential contrast image data in the second step for the fourth and following steps after accumulating those data for at least one area.

The potential contrast image data may be displayed on a monitor as an image to determine the specified portion by observing the displayed image.

The specified portion may also be obtained from a CAD data of the DUT based on the detected defect data of the DUT.

It could be applied to either of the above inventions that a potential data of a DUT and a potential data of a second IC are converted to color data respectively, and two images of the same wiring pattern are displayed on a same monitor screen side by side, and a specified wiring portion is displayed with a colored potential data on a wiring pattern image of the DUT, and the specified wiring portion is also displayed with a colored potential data on the other wiring pattern image of the second IC.

The apparatus of the present invention is constructed to implement each of the methods mentioned above. In other word, in an apparatus for irradiating a charged particle beam to an IC and for detecting a secondary electron emission to acquire a potential contrast image data, potential data acquisition means for acquiring a potential data associated with a specified wiring potential for each of the applied test patterns for the DUT and the second IC from each of the potential contrast image data of the DUT and the second IC respectively, and comparator means for comparing the acquired two potential data are provided.

The potential data acquisition means is means for taking out data of the specified wiring portion from a potential contrast image data to convert the data to a binary value or means for taking out data of the specified wiring portion in a potential contrast image data to convert the data to a multi-value data.

In the other view point of the apparatus of the present invention, the apparatus comprises potential data acquisition means for acquiring a binary value potential data associated with a specified wiring potential for each of the applied test patterns for the DUT and the second IC and means for displaying each potential data of the DUT and the second IC in a waveform for pattern addresses as a common axis.

In the further different view point of the apparatus of the present invention, the apparatus comprises potential data acquisition means similar to the potential data acquisition means in the above other view point, a conversion table containing selected numeric values for each of the reference numbers corresponding to the respective pattern addresses and for H and L binary value corresponding to the potential data (FIG. 9), summing means for accumulating the respective read numeric value from the conversion table in response to the each potential data for the DUT and the second IC, comparator means for comparing the accumulated values and mismatch address detecting means for identifying a test pattern address by which a mismatch operation is caused when the comparator means detects a mismatch.

PREFERRED EMBODIMENT OF THE INVENTION

Figure 1:
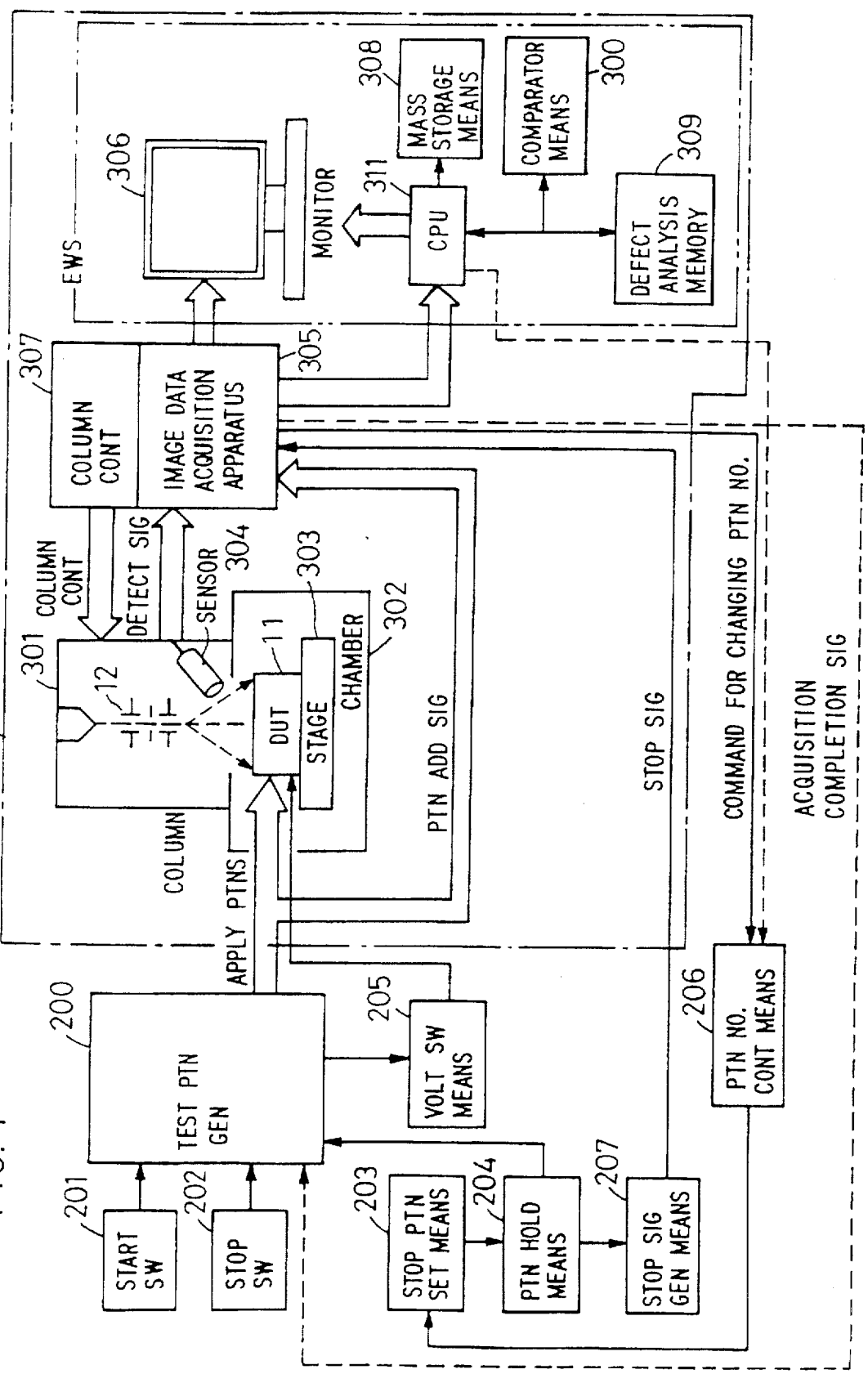
FIG. 1 is a block diagram showing an embodiment of an apparatus in accordance with the present invention.

FIG. 1 shows an embodiment of an apparatus of the present invention. An IC defect detecting apparatus 100 of the present invention comprises a test pattern generator 200 and a charged particle beam tester 300. An electron beam is generally used as the charged particle beam but other charged particle beam such as an ion beam may be used.

The test pattern generator 200 furnishes test pattern signals to an IC under test (referred to as DUT=Device Under Test hereinafter) 11 placed in the charged particle beam tester 300. The test pattern generator 200 includes a start switch 201 for starting the generation of the test patterns, a stop switch 202 for stopping the generation of the test patterns at any time, stop pattern setting means 203, pattern holding means 204 for stopping the test pattern update operations upon the detection of the test pattern of the test pattern address set in the stop pattern setting means 203, voltage switching means 205 for allowing the switching of the operation voltage being applied to the DUT 11 between the normal 5V and the abnormal 4V every time the test pattern update is stopped and restarted, and number of patterns controlling means 206 for controlling the number of generated test patterns. In such a configuration, a start control and a stop control of the test pattern signal generation, and a control for stopping the test pattern update at a particular test pattern address can be carried out. When the test pattern update operation is stopped by the pattern holding means 204, stop signal generating means 207 sends a stop signal to the charged particle beam tester 300.

On the other hand, the charged particle beam tester 300 comprises a column 301 for irradiating an electron beam 12 to the DUT 11, a chamber 302 provided under the column 301 in connection with the column 301 for positioning the DUT 11 in the vacuum therein, a stage 303 for moving the DUT 11 in X-Y directions thereon, and a sensor 304 for measuring amount of a secondary electron emission. Further, every time the test pattern generated by the test pattern generator 200 stops at the set pattern address, a detected electric signal of the sensor 304 corresponding to the potential distribution on the DUT 11 under the condition that the stop test pattern is furnished is taken into an image data acquisition apparatus 305. The potential contrast image data taken into the image data acquisition apparatus 305 is displayed on a monitor 306 as an image. The radiation and amount of the radiation (current value) of the electron beam 12, the acceleration voltage, the scanning speed and the scanning area etc. are controlled by a column control 307. The data corresponding to the potential of the wiring for check acquired in the image data acquisition apparatus 305 is stored in mass storage means 308 for each of non-defect and defect ICs for each test pattern. A part of the data stored in the mass storage means 308 is transferred to a defect analysis memory 309 piece by piece and a defect data and a non-defect data in the memory 309 are compared by comparator means 310. The data transfer to the monitor 306 from the image data acquisition apparatus, the data transfer to the mass storage means 308 from the image data acquisition apparatus 305, the data transfer to the defect analysis memory 309 from the mass storage means 308 and the comparison of the data at the comparator means 310 are performed in so called CPU 311. Incidentally, the monitor 306, the mass storage means 308, the defect analysis memory 309, the comparator means 310 and the CPU 311 can be arranged as so called an engineering workstation.

Figure 2:
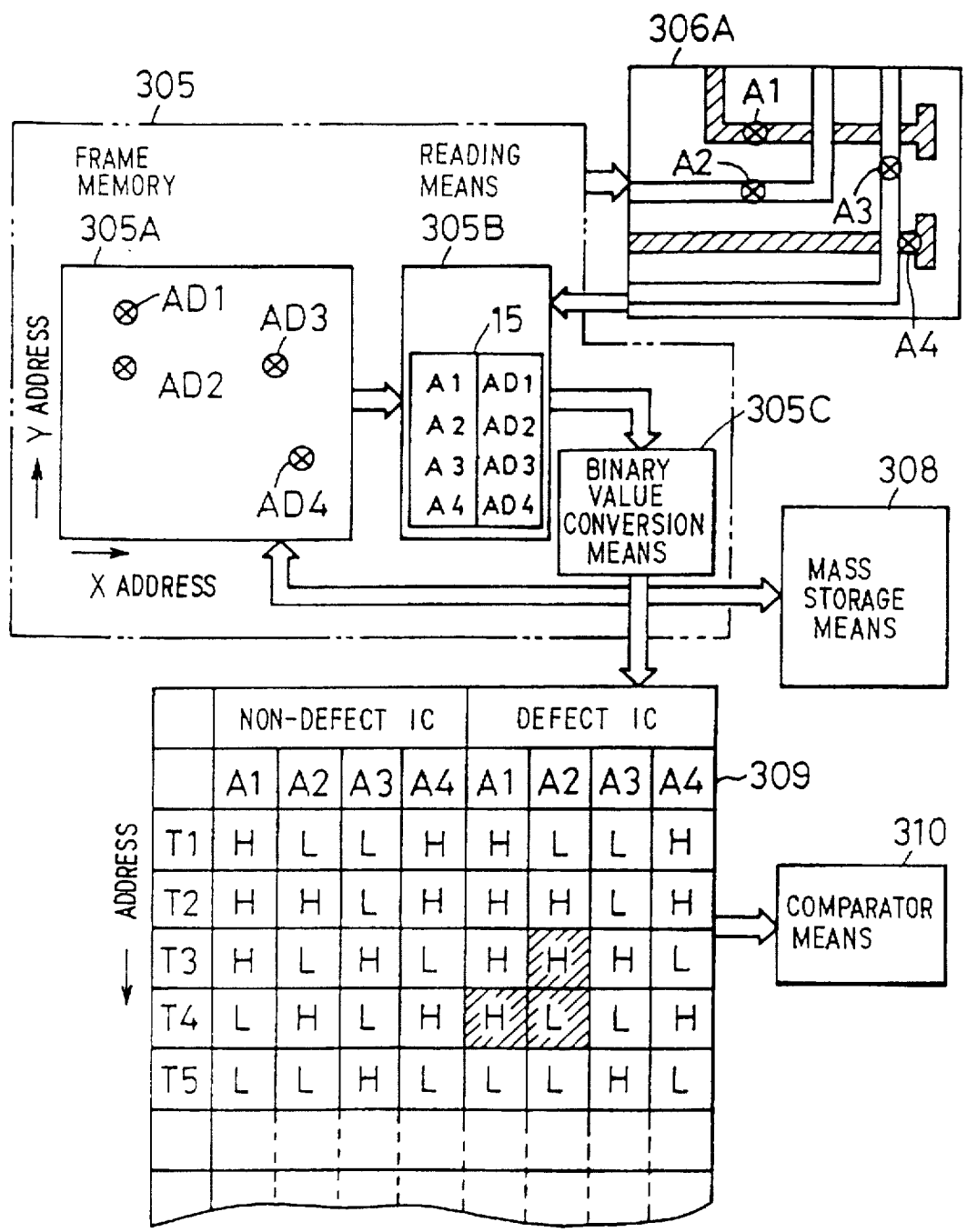
FIG. 2 is a block diagram functionally showing a main part of FIG. 1.

FIG. 2 functionally shows the image data acquisition apparatus 305 and the defect analysis memory 309. The image data acquisition apparatus 305 includes a frame memory 305A for storing an image data from a sensor 304 and the frame memory 305A provides the number of addresses corresponding to the number of pixels sufficient to display full screen of a potential contrast image display part 306A of the monitor 306. A tone signal for each pixel of a potential contrast image data is stored in each of the addresses. In other word, an analog voltage signal corresponding to the number of electrons detected by the sensor 304 is converted, for example, to a digital tone signal of 256 levels of 8 bits, and this digital signal is stored in each address of the frame memory 305A corresponding to the irradiated spot of a charged particle beam to acquire an image data. The acquisition of the image data is performed every time the update of the applied test patterns stops at the predetermined test pattern address and the test pattern address at which the update of the applied test pattern is stopped is stepped back sequentially to the prior test pattern address to acquire a potential contrast image data of the DUT 11 in the respective condition that each update stopped test pattern is applied.

For example, test patterns are sequentially applied to a DUT 11 first by an IC tester. Then, the output of the DUT is compared with the corresponding expected value for each test pattern. Then, a test pattern address by which a first mismatch is detected is identified. Alternatively, test patterns are applied to the DUT 11 from a test pattern generator 200 and then the output is compared with the corresponding expected value. The test patterns are updated until a mismatch (fail) is detected. In this state (the first mismatch is detected), the test pattern update is stopped. Then, a charged particle beam is irradiated to the DUT while the update stopped test pattern is applied to the DUT to acquire the potential contrast image data. In the case that the test pattern address of the first fail is obtained from the IC tester, this update stopped test pattern address is set in the stop pattern setting means 203 and then, the test patterns are applied to the DUT starting from the first test pattern address. When a test pattern address being applied matches the address set in the stop pattern setting means 203, the pattern holding means detects this and stops the test pattern update. Under the condition that the update stopped pattern is applied to the DUT 11, a stop signal is sent to the image data acquisition apparatus 305 from the stop signal generating means 207.

Figure 3:
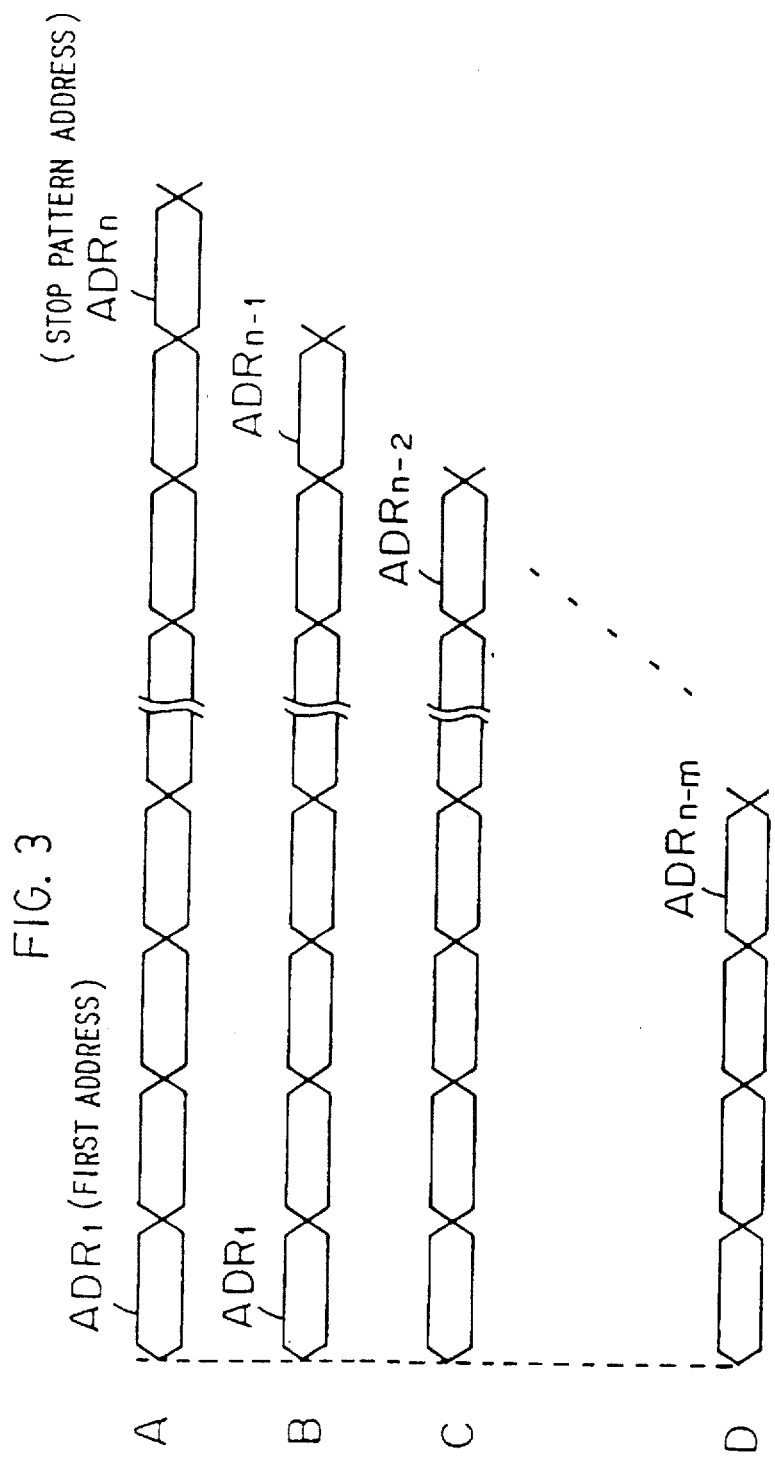
FIG. 3 is a diagram showing the states that the stop pattern is stepping back.

When the potential contrast image data of one screen corresponding to the potential contrast image display part 306A of the monitor 306 is acquired, the image data acquisition apparatus 305 sends an acquisition completion signal to the number of patterns control means 206. Upon receipt of the acquisition completion signal, the number of patterns control means 206 decrements by one the stop address set in the stop pattern setting means 203 and then the test pattern generator 200 generates the test patterns again starting from the first pattern address. Thus, assuming that $ADR_n$ is the pattern address of the first fail, as shown in FIG. 3, the test patterns are generated starting the first test pattern address $ADR_1$ and are applied to the DUT 11 sequentially. When the test pattern of address $ADR_n$ is generated, the test pattern update is stopped and a potential contrast image data is acquired in that condition. Then, as shown in FIG. 3B, the test patterns are applied to the DUT 11 again starting from $ADR_1$. When the test pattern of address $ADR_{n-1}$ (which is the previous address of $ADR_n$) is generated, the test pattern update is stopped and a potential contrast image data is acquired in that condition. Similarly, the successive processes are performed by decrementing the stop address by one and a potential contrast image data is acquired each time.

Generally, the wiring surface area of the DUT 11 is considerably larger than the maximum scanning area of a charged particle beam 12 of the charged particle beam tester 300. Therefore, in order to acquire the potential image data for the entire surface area of the IC 11, the potential image data acquisition process must be repeated a number of times by moving the IC 11 by an XY stage 303. Therefore here, an output pin of the IC 11 of the first fail and a logic circuit coupled to the output pin are tracked and the acquisition of the potential image data is performed only for a defect candidate area where a defect is presumed. The defect candidate area may be presumed by an operator based on the circuit arrangement or may be specified automatically by utilizing a design CAD data of the IC 11. The size of the defect candidate area is within the maximum scan area of a charged particle beam 12 and a plurality of defect candidate areas may be specified.

Figure 4:
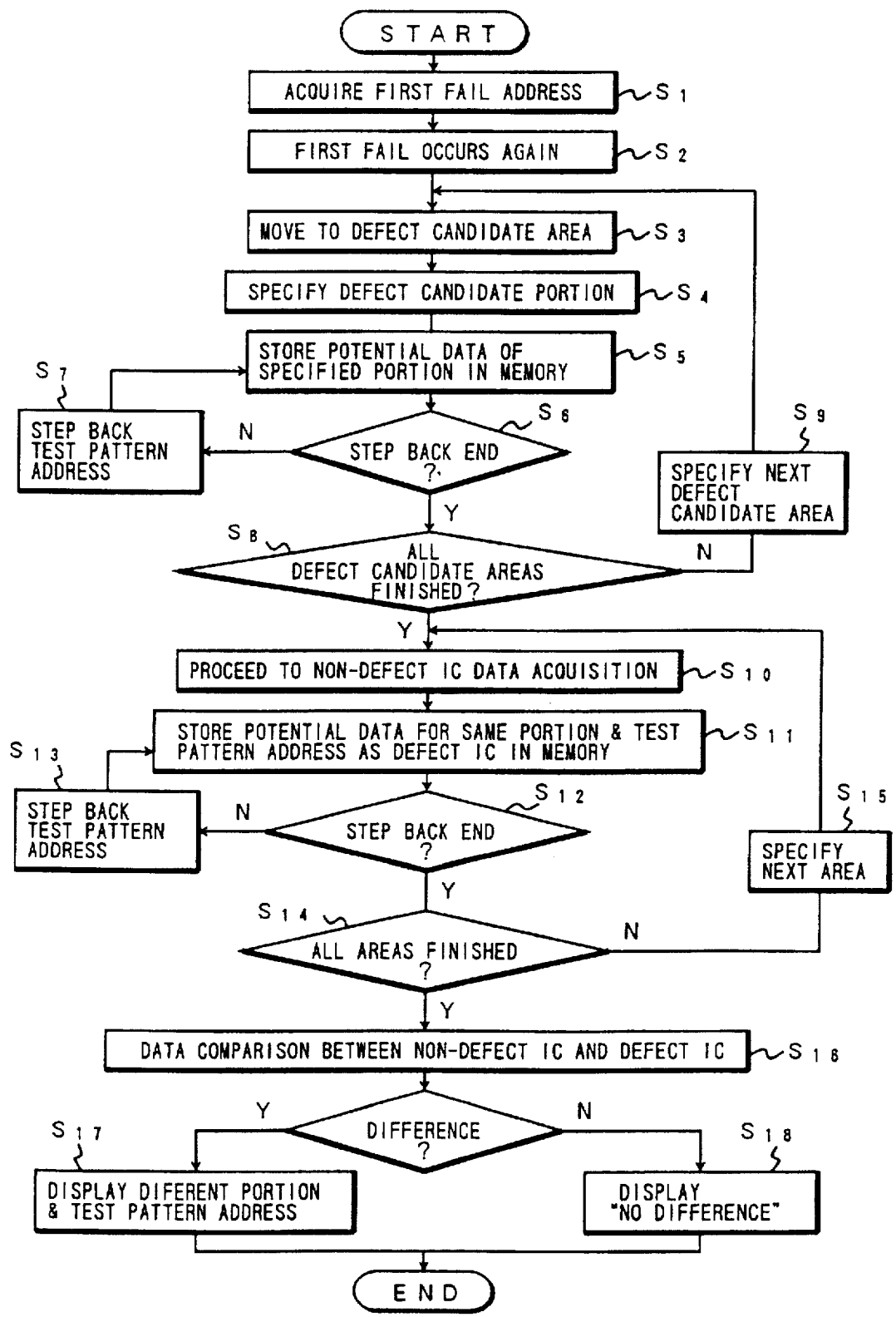
FIG. 4 is a flow chart showing a process sequence of an embodiment of a method of the present invention.

In summary, as shown in FIG. 4, in the method of the invention, a test pattern address of the first fail is obtained from an IC tester ($S_1$). Then the test patterns are applied to the IC 11 up to the pattern address at which the first fail occured thereby to make the fail state of the IC 11 occur again ($S_2$). Then, as described above, the IC 11 is moved so that one of the specified defect candidate area can be scanned by a charged particle beam 12 ($S_3$). In this state, a defect candidate portion which is presumed to be associated with the fail within the defect candidate area is specified ($S_4$). In this process, for example, a potential contrast image data of the specified defect candidate area is acquired and displayed on the potential contrast image display part 306A of the monitor 306 as shown in FIG. 2. Then an operator observes the screen and specifies the checking points as A1, A2, A3 and A4 by input means such as a mouse or a light pen on the wiring images presumed from the first fail output pin. By this operation, the addresses AD1, AD2, AD3 and AD4 of the frame memory 305A corresponding to the checking points A1, A2, A3 and A4 respectively are stored in the memory part 15 of the reading means 305B provided on the frame memory 305A.

The checking points A1, A2, A3 and A4 are preferably specified at the center of the width directions of the wiring image and may be specified at multiple spots on the length direction of the wiring image so that the acquisition of the potential data of the wiring can be assured.

The reading means 305B reads out the potential data from the checking addresses AD1, AD2, AD3 and AD4 of the frame memory 305A. Each of the potential data read out by the reading means 305B is converted to a binary value H or L by binary value converting means 305C which contains a threshold value to determine white or black as necessary and the binary values are stored in the mass storage 308 ($S_5$).

Then a check is made to see if the stepping back of the test pattern address is completed ($S_6$). If not completed, the pattern address in the stop pattern address setting means is decremented by one and the process returns to $S_5$ ($S_7$) as described above. Then the test pattern of address $ADR_{n-1}$ is applied to the DUT 11 and the potential data in the addresses AD1, AD2, AD3 and AD4 corresponding to the specified portions A1, A2, A3 and A4 respectively in the acquired potential contrast image data are acquired and stored in the mass storage means 308. Similarly, the stop test pattern address is decremented by one and the potential data of the specified portions A1-A2 i.e., addresses AD1-AD4 under the decremented stop pattern address are stored in the mass storage means 308. In the practical way, when the acquired potential data are stored to some extent in the memory of CPU 311, those data are usually transferred in batch to the mass storage means 308.

The ending point of the pattern address step back is the first pattern address in an extreme case. Alternatively, the ending point could be predetermined based on the experimental data. When the step back of the test pattern address is completed a check is made to see if there is any remaining defect candidate area ($S_8$). If any, a next defect candidate area is specified and the process returns to step $S_3$ ($S_9$). Thus, the DUT 11 is moved to acquire the potential data of the defect candidate portion (wiring) similarly in the next defect candidate area for each test pattern address.

In step $S_8$, if no remaining defect candidate area, the process proceeds to the data acquisition for a non-defect IC. A non-defect IC of the same kind as the DUT 11 is placed on the XY stage 303. The position of the non-defect IC is moved by utilizing the position information obtained for acquiring the potential data of the previous defect IC (DUT 11). That is, the position of the non-defect IC is moved to a position of the area corresponding to the defect candidate area for the defect IC where the potential data can be acquired ($S_{10}$). The potential data of the non-defect IC is acquired from the same portion corresponding to the defect candidate portion (wiring) of the defect candidate area in the defect IC for each of the same test pattern address and then the data is stored in the mass storage means 308 ($S_{11}$). Then, a check is made to see if the step back of the test pattern address is completed ($S_{12}$). If not completed, the stop test pattern address is decremented by one and the process returns to step $S_{11}$ ($S_{13}$). In such a manner, when the potential data of the respective wiring in the area of non-defect IC corresponding to the defect candidate area of the defect IC is acquired for each stop test pattern address, a check is made to see if there is any remaining area ($S_{13}$). If there is any remaining area corresponding to the defect candidate area, a next area is specified and the process returns to step $S_{11}$ ($S_{15}$).

In such a manner, when the potential data for each portion of each area of the non-defect IC corresponding to the defect candidate portion of the defect candidate area is acquired, defect IC data is compared with the non-defect IC data ($S_{16}$). This comparison is performed between the data of the corresponding portions of the corresponding areas for each pattern address. An appropriate amount of data is transferred to the defect analysis memory 309 from the mass storage means 308 and the comparison is performed by the comparator means 310. The defect analysis memory 309 is organized as shown in FIG. 2 such that each binary converted potential data for each of the portions (wiring portions) A1, A2, A3 and A4 for a defect IC and a non-defect IC for the test pattern address $ADR_n$ is stored in an address T1 and the binary value potential data for each of the portions A1–A4 for a defect IC and a non-defect IC for the next pattern address $ADR_{n-1}$ is stored in an address T2 respectively. Similarly, the other potential data are stored.

The comparator means 310 compares the binary data stored in the defect analysis memory 309 in the basis of the same pattern address and the same portion (wiring). In other word, the binary data of the portion A1 of the non-defect and the binary data of the portion A1 of the defect, similarly A2 of the non-defect and A2 of defect . . . are compared respectively for each of the pattern addresses Ti (i=1, 2, . . . ). T1 corresponds to the test pattern address $ADR_n$, T2 corresponds to $ADR_{n-1}$ . . . . By each of the above comparison, the test pattern address containing mismatch data between a defect IC and a non-defect IC is identified. In the example in FIG. 2, the addresses T3 and T4 contain mismatch data and the mismatch data in the defect side are hatched. When a mismatch occurs, the mismatch defect candidate portion and the test pattern address are displayed on the monitor 306 ($S_{17}$). If no mismatch, "no mismatch" is indicated on the monitor 306 ($S_{18}$).

Such a comparison of the logical states can easily be performed by CPU 311. By knowing the mismatch address Ti, the mismatch test pattern address can be known. Also, a defect location can be presumed from the mismatch wiring. A potential contrast image data of the defect IC 11 under the applied test pattern can be displayed on the potential contrast image display part 306A based on the mismatch wiring address.

Incidentally, although a multi-value tone data acquired in the frame memory 305A is converted to a binary value by the binary value conversion means 305C and is written in the mass storage means 308 in the above embodiment by arranging the mass storage means 308 and the defect analysis memory 309 as multi-value storage, the multi-value tone data stored in the frame memory 305A is written in the defect analysis memory 309 for the comparison.

Figure 5:
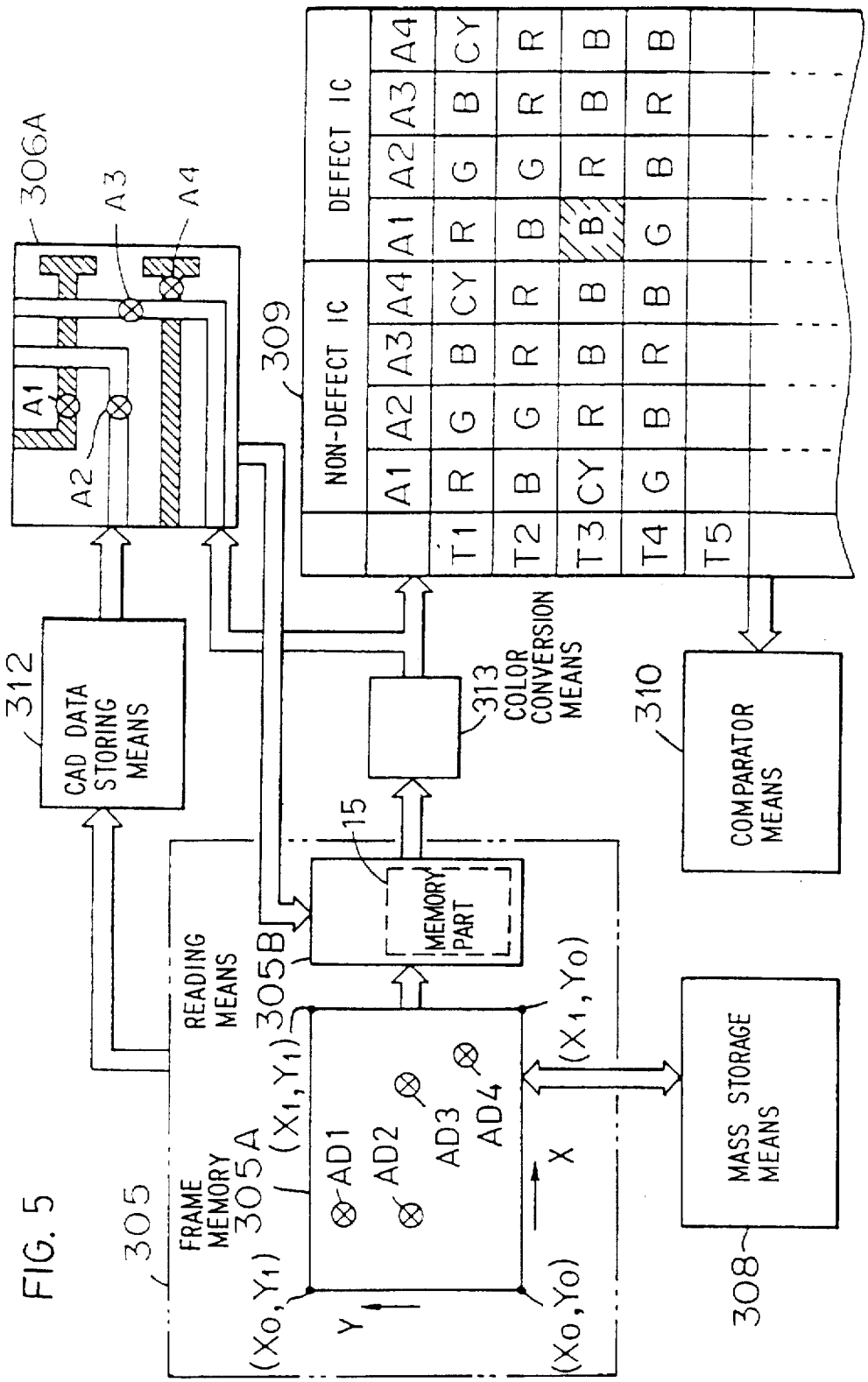
FIG. 5 is a diagram showing a main part of an embodiment for using a CAD data to display wiring patterns and for acquiring a potential data as a color data.

FIG. 5 shows another embodiment of the present invention. In this example, a wiring layout image corresponding to a potential contrast image is displayed on the potential contrast display part 306A of the monitor 306 utilizing a CAD data and each wiring pattern in the layout image is displayed in color corresponding to the potential. The use of the wiring layout from the CAD data provides an advantage that the image quality of the wiring pattern corresponding to the potential contrast image of the non-defect IC can be improved.

For example, four corner addresses (X0, Y0), (X1, Y0), (X0, Y1) and (X1, Y1) indicating a defect candidate area of an IC 11 of a potential contrast image data to be acquired in the frame memory 305A are acquired and sent to CAD data storage means 312 and CAD data corresponding to the area is read out from the CAD data storage means 312. The read CAD data is sent to the monitor 306 and the layout image is displayed on the potential contrast image display part 306A. The checking points i.e., the defect candidate portions (wiring portions) A1, A2, A3 and A4 are inputted on the layout image displayed on the monitor 306 using input means such as a mouse or a light pen. The defect candidate portions A1, A2, A3 and A4 inputted by the input means are taken into the memory part 15 of the reading means 305B and the addresses on the frame memory 305A corresponding to the respective defect candidate portions AD1, AD2, AD3 and AD4 are set in the memory part 15.

Figure 6:
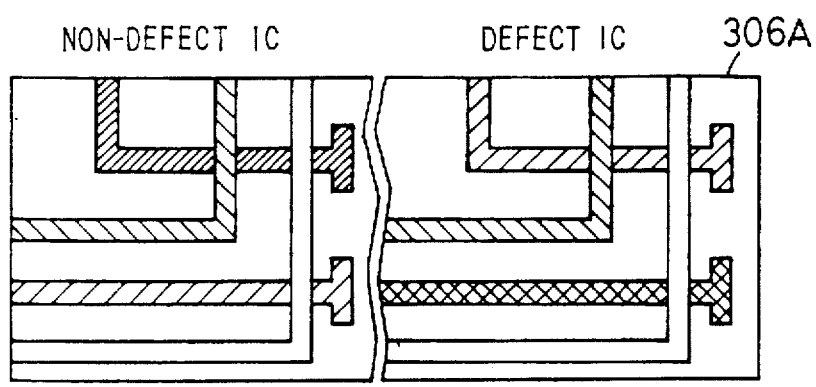
FIG. 6 is a diagram for showing an example where each of the specified wiring portions of a DUT and a non-defect IC is displayed in one of different colors.

A digital tone data (potential data) in each address of AD1, AD2, AD3 and AD4 acquired in the memory 305A in the potential contrast image data of non-defect IC or defect IC is read out by the reading means 305B. The digital tone data read out by the reading means 305B is inputted to color conversion means 313 to convert the potential state of each defect candidate portion of A1, A2, A3 and A4 to a color signal. The color signal is given to the monitor 306 to provide a color to each of the wiring patterns of the respective defect candidate portions A1, A2, A3 and A4 in the wiring image obtained from the CAD data. Thus, the wiring patterns displayed on the monitor 306 are colored responsive to the potential states of the wiring patterns so that the identification can be easily made. In other word, as shown in FIG. 6, for example, the colored wiring pattern of the non-defect IC is displayed on the left half of the potential contrast image display part 306A and the colored wiring pattern of the defect IC is displayed on the right half. By this, the difference between the two (non-defect/defect) can be easily identified.

Incidentally, the color converted potential data is sent to the defect analysis memory 309 and this color data is stored in the memory for each pattern address as described referring to FIG. 2. In the example of FIG. 5, a potential data is converted to one of R (red), G (green), B (blue) and CY (cyan). Since CPU 311 provides up to 4000 colors, different colors can be allocated to all of the 256 tone data. The color data in the defect analysis memory 309 can be compared by the comparator means 310 for the color difference between a non-defect IC and a defect IC. In other word, each color data handled in the CPU 311 has a unique symbol (number) and match/mismatch of the symbol (number) may be checked for each of the pattern addresses T1, T2, T3 . . . The effect of the operation in CPU 311 is same as that of the multi-tone case in the embodiment in FIG. 2 and in this case, an easy identification on the monitor display is provided.

Figure 7:
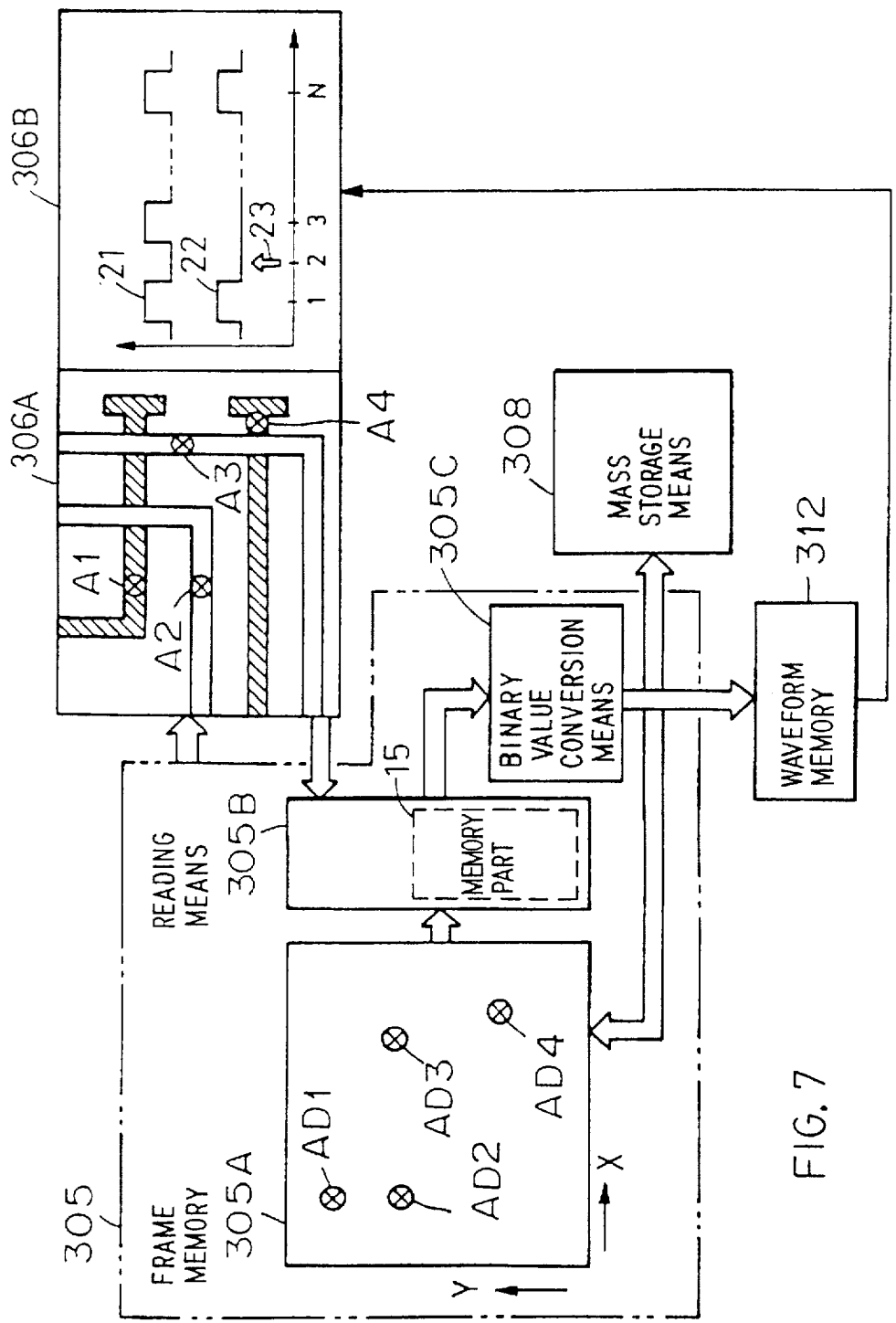
FIG. 7 is a block diagram showing an example of an embodiment of the present invention where a potential data is displayed as a waveform.

In the embodiment shown in FIG. 2, the binary value potential data of the same defect candidate porion in the same defect candidate area is read out for each of the non-defect IC and the defect IC in the order of the test pattern addresses from the data stored in the mass storage means 308 and is stored in a waveform memory 312 as shown in FIG. 7. The variations of the binary value data based on the variations of the test pattern addresses for each of the non-defect IC and the defect IC stored in the waveform memory 312 are displayed up and down on the waveform display part 306B of the monitor 306 as the curves (waveforms) 21 and 22 respectively. In the display part 306B, the horizontal axis indicates the values of the test pattern addresses or the values corresponding to the test pattern addresses. In this example, the waveform of the non-defect IC 21 and the waveform of the defect IC 22 do not match at the test pattern address 3. This mismatch portion may be indicated by a cursor 23, and the mismatch portion on the IC 11 and the associated test pattern address may be displayed on the monitor 306.

Figure 8:
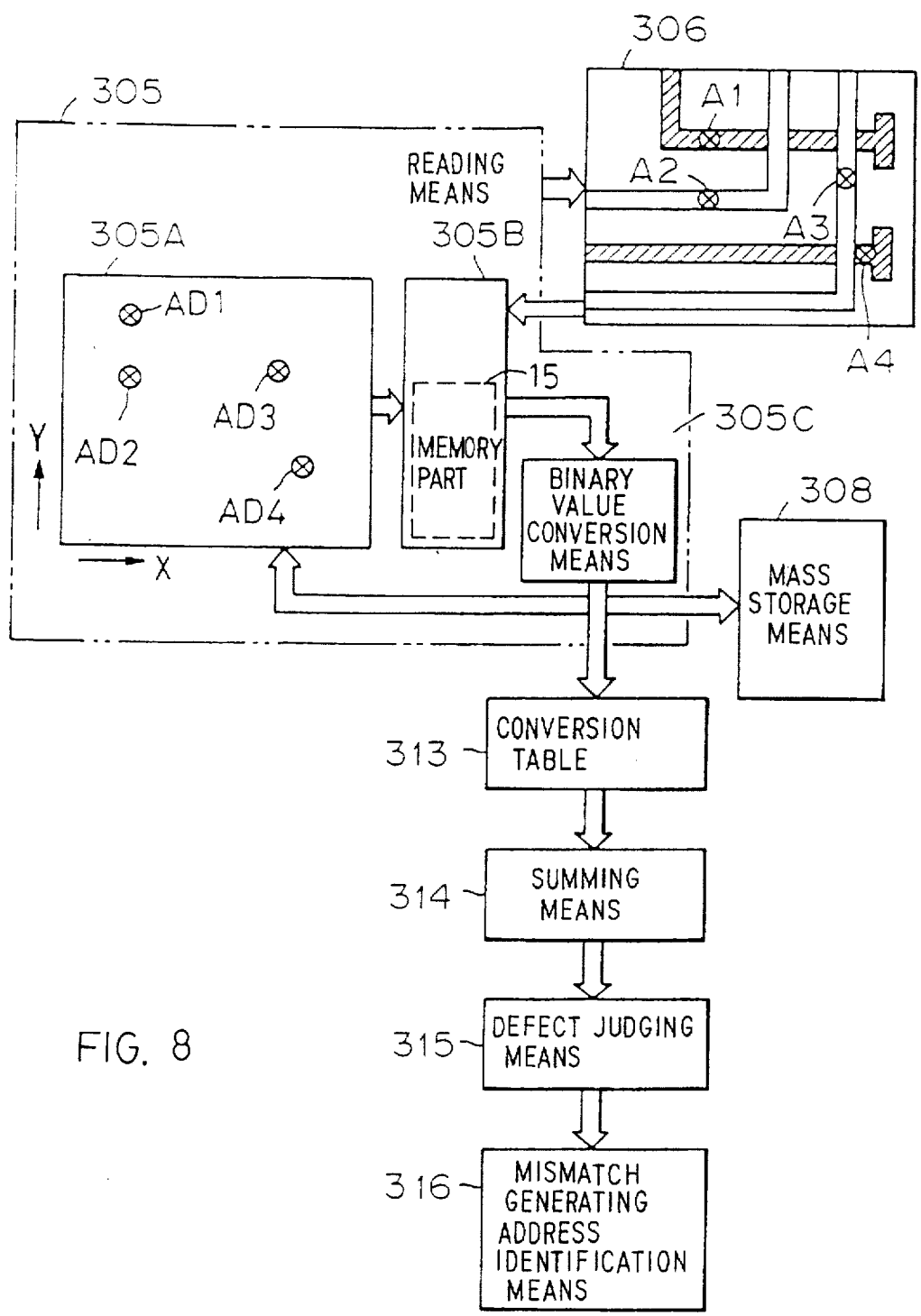
FIG. 8 is a block diagram showing a main part of an embodiment where a potential data is converted to a numeric value and the numeric value is accumulated.
Figures 9, 13:
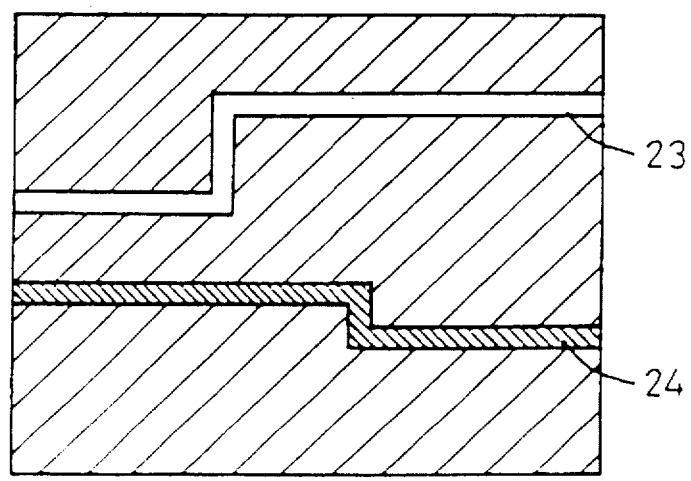
FIG. 9 is a diagram showing a specific example of a conversion table 313.
FIG. 13 is a diagram showing an example for displaying a summed data acquired in the process sequence in FIG. 12 as an image.

FIG. 8 shows a further different embodiment. The binary value potential data from the mass storage means 308 acquired as shown in FIG. 2 are sent to a conversion table 313 and are converted to values changing in response to both of the value of logical H or L and the test pattern address. FIG. 9 shows a conversion example of the conversion table 313. At the pattern address 1, if the input value is logical H, then the output value is "1". If the input value is logical L, then the output value is "10". At the pattern address 2, the output is "100" for the input H and the output is "1,000" for the input L. In such a way, the output values are selected to construct the conversion table 313 such that the sum of the output values (taken dependent on H or L) for all the applied test patterns is different if at least one mismatch between the non-defect and the defect ICs is present. The output values of the conversion table 313 corresponding to the respective binary value data taken out from the mass storage means 308 are summed up by a summing means 314 for all the applied test patterns for each of the non-defect IC and the DUT. Then the summed values for each of the non-defect IC and DUT are compared by defect IC judging means 315. If both values match, the DUT is judged as a non-defect IC. If mismatch, the DUT is considered to be a defect IC. Then, the summing process is tracked back to search the test pattern address by which the mismatch is caused. The mismatch pattern address can be identified as the last mismatch address from the back. This search operation is performed by the mismatch generating address identification means 316 without an operator intervention.

Figure 10:
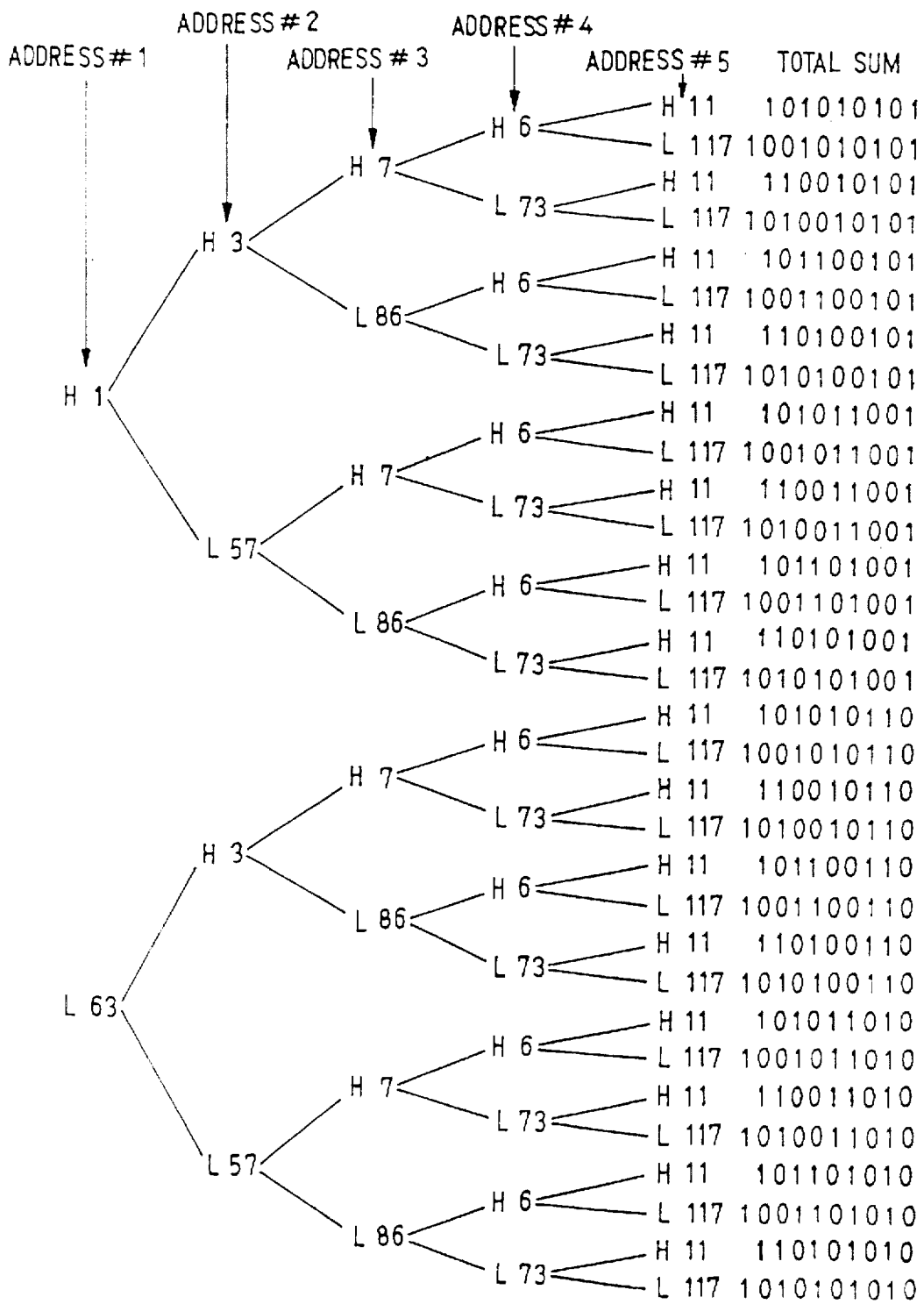
FIG. 10 is a diagram showing an identification process in mismatch generating address identification means 316 in FIG. 8.

In the example of the conversion table shown in FIG. 9, as shown in FIG. 10, if a series of binary value potential data for a certain test pattern is inputted and if the binary value at first address #1 is logical H, the summing value is "1", if the binary value is logical H at second address #2, 100 is added, and if logical L, 100 is added. Then, in the case of logical H at address #2, 10,000 is added for logical H or 100,000 is added for logical L at address #3. Similarly, dependent on the logical value at first address #1, at second address #2 the binary value potential data branches to logical H or L based on the values "1" or "10" as a root. Thus, this embodiment provides two tree structures as shown in FIG. 10. The sum of the values at the branch points on each path from the root provides a unique number different from any of the summed value. Therefore, if the summed results for the non-defect IC and the defect IC are mismatch, the address is tracked back on the same path until the address where the two summed values (for non-defect and defect) match. The next address of the above address corresponds to the test pattern address by which the mismatch is caused. If the summed values for non-defect and defect ICs are compared each time a new value is added, the process for tracking back the tree can be eliminated.

In the above description, a potential data of each defect candidate portion (wiring) and the corresponding non-defect IC data are stored once in the mass storage means 308 and afterward these data are taken out to compare between non-defect IC and DUT. Alternatively, after a potential contrast image data of each defect candidate area for each test pattern address and the corresponding potential contrast image data of a non-defect IC are stored in the mass storage means 308, these data may be taken out from the mass storage means 308 and then the data of the defect candidate portion (wiring) and the corresponding non-defect IC data may be selected for the processing.

The process sequence in this case is shown in FIG. 11. In FIG. 11, the same step symbol is assigned to a process corresponding to FIG. 4. In this example, the process steps $S_1$, $S_2$ and $S_3$ in FIG. 4 are performed first. In this embodiment, a potential contrast image data representing the potential distribution of the entire area of the moved IC 11 is acquired and stored in the mass storage means 308 ($S_{21}$) The acquisition of the potential contrast image data is performed every time the test pattern address is stepped back one address by one address ($S_6$, $S_7$). When each potential contrast image data is acquired for each of the target test pattern addresses (step back process is completed), the process returns to step $S_3$ until all the remaining defect candidate areas are processed. Thus, the potential contrast image data for all the defect candidate areas are acquired for each of the test pattern addresses and stored in the mass storage means 308 ($S_8$, $S_9$, $S_3$).

When the necessary potential contrast image data for the DUT 11 are acquired, the process proceeds to the corresponding data acquisition process for the non-defect IC as in FIG. 4. The non-defect IC is moved to the area corresponding to the defect candidate area in step $S_9$ as in FIG. 4, and then the potential contrast image data of that area is acquired similarly to step $S_{21}$, and is stored in the mass storage means 308 ($S_{22}$). This potential contrast data data acquisition is performed for each test pattern address by stepping back the pattern address one by one ($S_{12}$, $S_{13}$). If there is any remaining area, the non-defect IC is moved to the area and similar data acquisition is performed for each test pattern address ($S_{14}$, $S_{15}$). When all the necessary potential contrast image data for a non-defect IC are acquired in such a manner, a potential contrast image data for one area of the DUT for one pattern address is read out from the mass storage means 308 and displayed on the monitor 306. Then, the defect candidate portions (wiring portions) are specified ($S_4$) as in step $S_4$ of FIG. 4 by a cursor pointing by an operator or by an automatic pointing from the CAD data. Incidentally, the defect candidate portions may also be automatically specified using the CAD data in step $S_4$ of FIG. 4.

Then, each data (potential data) of each defect candidate portion specified in step $S_4$ is extracted from the two (defect/non-defect) potential contrast image data for the specified defect candidate area and the corresponding non-defect IC area for the specified pattern address stored in the mass storage means 308. Then, these two potential data are compared for the same specified portion ($S_{23}$). If the comparison result indicates a mismatch, the mismatch portion and the corresponding test pattern address are displayed on the monitor 306. If no mismatch, "no mismatch" is indicated ($S_{24}$). Incidentally, the comparison in step $S_{24}$ can be performed with multi-value data or with binary value data as in FIG. 2, or with colored data if the potential contrast image data are displayed on the monitor 306 in color.

Then a check is made to see if all the test patterns are specified for that specified area ($S_{25}$). If not all, next test pattern address is specified and process returns to step $S_{23}$ ($S_{26}$). In such a manner, when the comparisons of the potential data of the specified portions are completed for the specified area and for all the test patterns, a check is made to see if all the areas are specified ($S_{27}$). If not all, the next area is specified and the process returns to step $S_4$ ($S_{28}$).

Then, similarly for the newly specified area, defect candidate portions are specified and the comparisons of the specified portions are performed for all the test pattern addresses.

When all the areas are specified and the associated processes are completed, all the mismatch portions and the corresponding test pattern addresses are displayed or "no mismatch is indicated on the screen ($S_{29}$).

In such a process, after step $S_{29}$ or after step $S_{24}$ if necessary, a potential contrast image data including presumed defect portions can be displayed on the monitor 306.

This process for specifying defect candidate portions after all the potential contrast image data are acquired can be applied to the embodiments shown in FIGS. 7 and 8. When this is applied to the embodiment shown in FIG. 7, in step $S_{23}$, the potential data of the specified portions in the specified area are extracted in the order of the test pattern addresses for each of the non-defect IC and the defect IC simultaneously or either data for non-defect IC or defect IC is extracted first and then the other data is extracted later. Then those data are converted to binary values to display on the monitor 306 via the wavefarm memory 312. For the embodiment shown in FIG. 8, similarly to the embodiment in FIG. 7, the potential data of the specified portions in the specified area are extracted in the order of the test pattern addresses for either of non-defect IC or defect IC first and then the other later, and then those data are inputted to the conversion table 313. In either case, the process for all the test pattern addresses is not necessarily performed in a batch but can be divided in separate processes as required.

Figure 12:
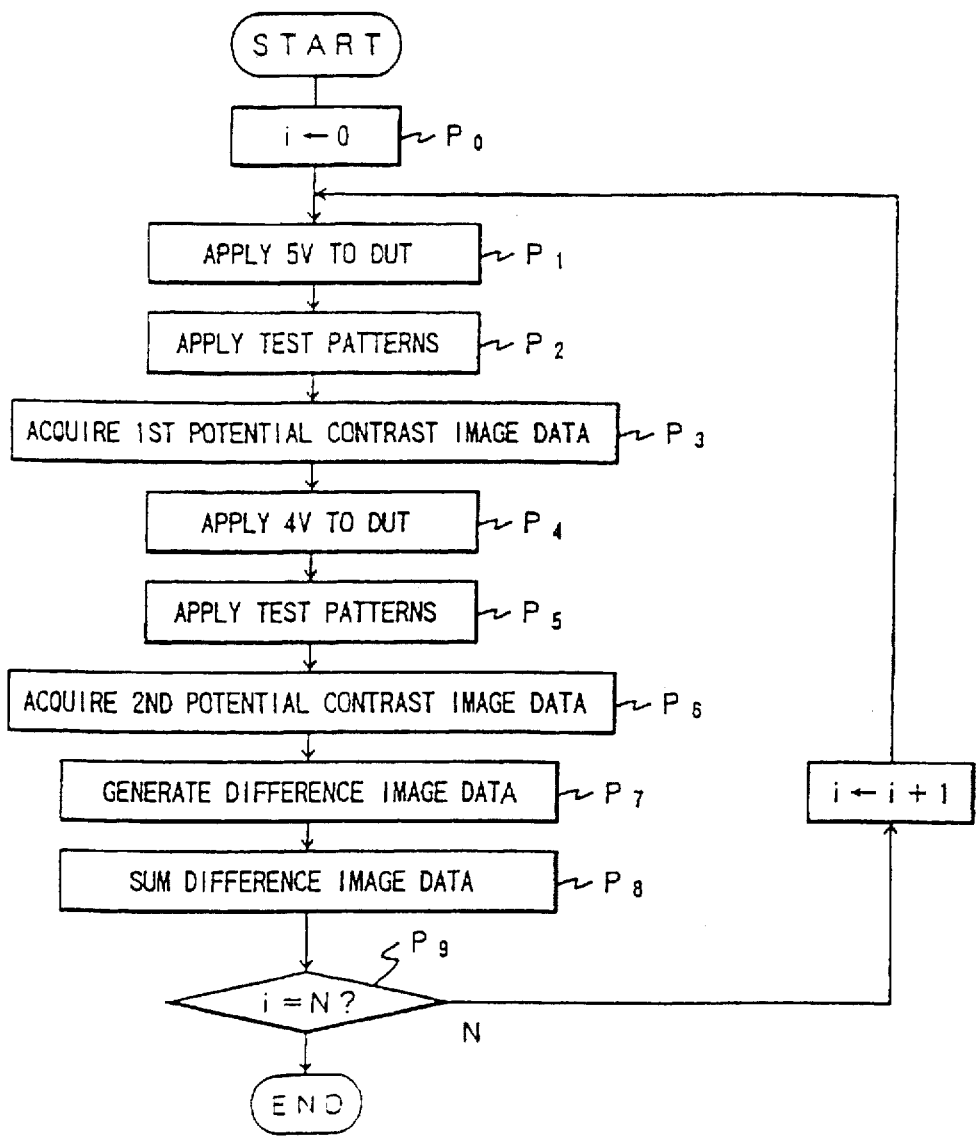
FIG. 12 is a flow chart showing an example of a process sequence for acquiring a difference image data (summed data) as a potential contrast image data in order to create a potential data.

In the comparison between the non-defect IC and the defect IC, the potential data itself may be used or the processed potential data may be used. For the process of the potential data, for example, the process flow shown in FIG. 12 can be utilized. First, i is initialized to 0 ($P_0$) and the normal power supply voltage 5V (for example) is applied to the DUT 11($P_1$) and then the test patterns are applied to the DUT until a preset stop pattern address is applied ($P_2$) and a potential contrast image data (referred to as a first potential contrast image data) is acquired ($P_3$). Then the power supply voltage is changed to the abnormal 4V, for example, ($P_4$) and the test patterns of $P_2$ are applied to the DUT again ($P_5$), and then a potential contrast image data (referred to as a second potential contrast image data) is acquired ($P_6$). Then a difference image data between the first potential contrast image data and the second potential contrast image data is generated ($P_7$) and this difference image data is added to the accumulated difference image data to obtain a summed data ($P_8$). Then a check is made to see if i is N ($P_9$) and if i is not N, then 1 is added to i and the process returns to $P_1$ ($P_9$). These steps are repeated N times. When the summed data obtained in such a way is displayed on the monitor 306, if there is a difference between the first potential contrast image data and the second potential contrast image data, the difference is intensified. Thus, a display image shown in FIG. 13 can be obtained. In FIG. 13, a white pattern 23 and a black pattern 24 are displayed. The white pattern 23 indicates a wiring where the first potential contrast image data is high level and the second potential contrast image data is low level. The black pattern 24 indicates a wiring where the first potential contrast image data is low level and the second potential contrast image data is high level. A specific process method shown in FIG. 12 is described, for example, in U.S. patent application Ser. No. 08/337,230.

Figure 11A:
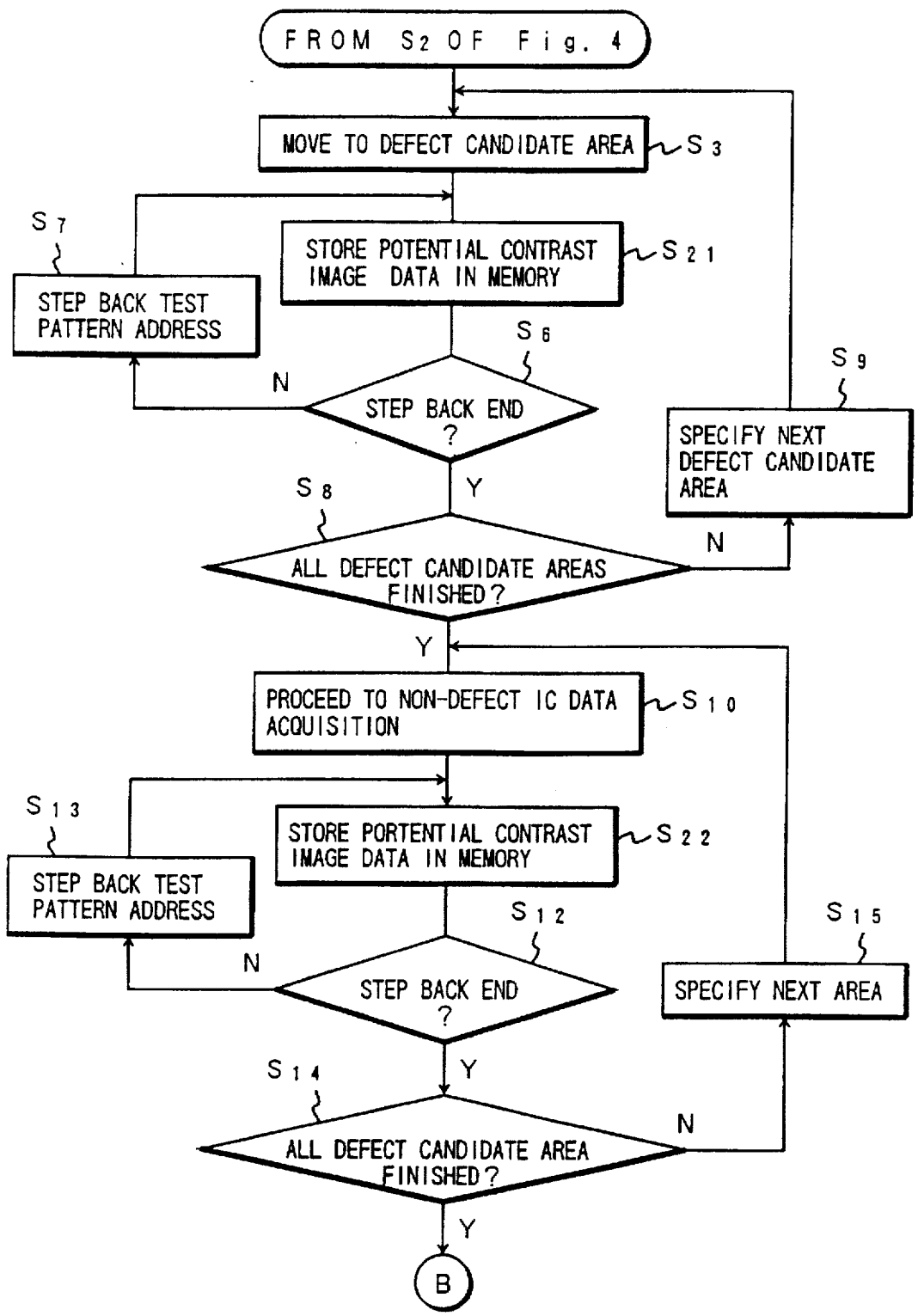
FIGS. 11A and 11B are flow charts showing another embodiment of a method of the present invention.
Figure 11B:
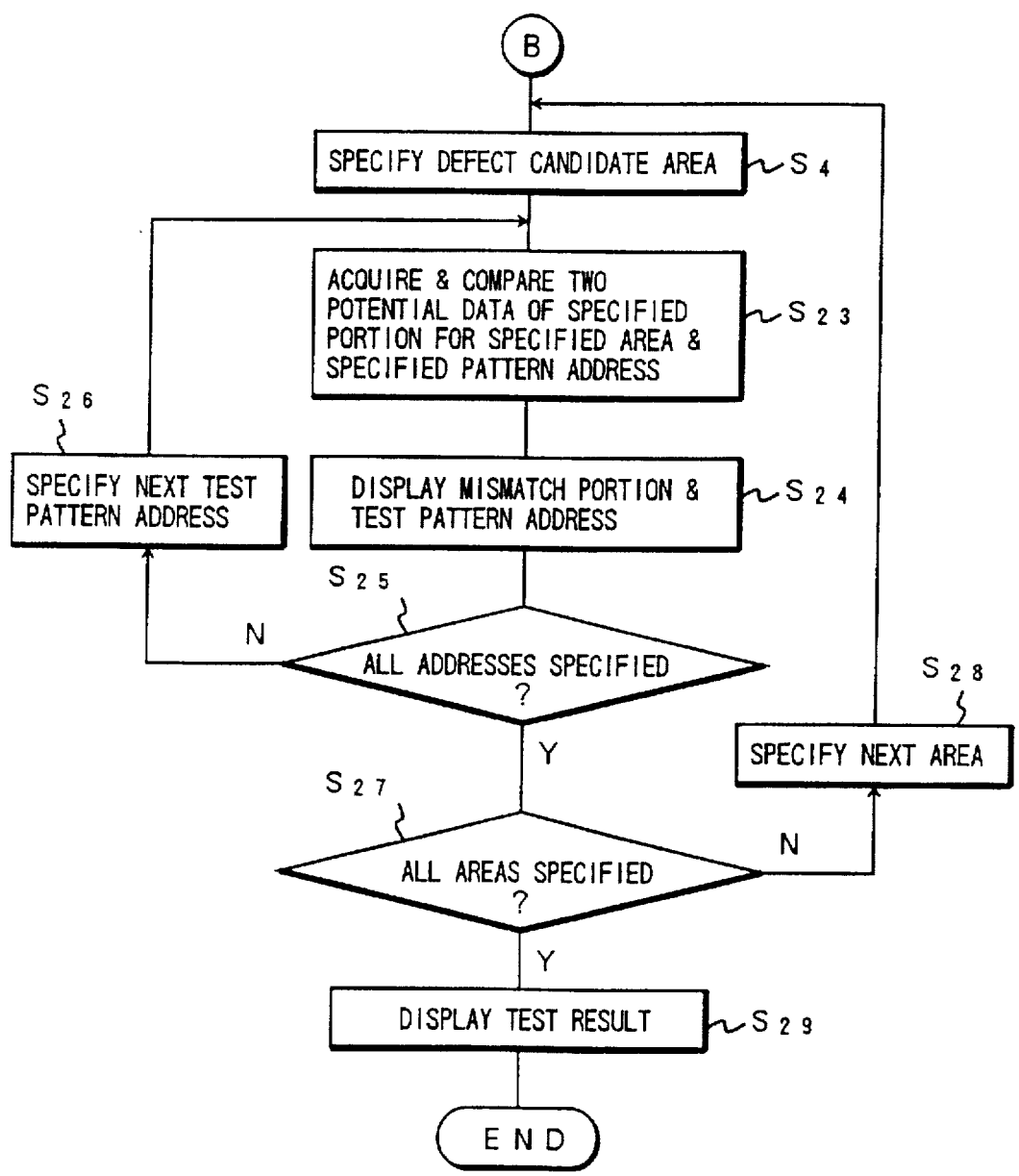

In each process shown in FIGS. 4 and 11A–11B the summed data obtained in FIG. 12 can be used as the potential data of the specified portion for either of the non-defect IC or the defect IC. For the process shown in FIG. 12, as indicated by a dotted line in FIG. 1, an acquisition completion signal from the image data acquisition apparatus 305 is inputted to the test pattern generator 200 rather than to the number of patterns control means 206. Then, the test patterns are generated starting from the first address and the voltage switching means 205 switches the supply voltage from normal 5V to abnormal 4V or vice versa. When the predetermined number (N) of the summed difference image data are obtained, a number of patterns changing command is supplied to the number of patterns control means 206 from the CPU 311 as shown by a dotted line. Then the stop pattern address set in the stop pattern setting means 203 is decremented by one by the control means 206.

In the process of FIG. 12, a plurality of difference image data are summed up in order to intensify the difference portion between the first potential contrast image data and the second potential contrast image data. Thus, only one difference image data (without summing up) could be used. The acquisition of this difference image data (summed) may be performed only for the defect candidate area in FIG. 4 and the corresponding non-defect IC area.

Incidentally, the test patterns are applied up to the first fail pattern address given by the IC tester to perform the process shown in FIG. 12 for the entire surface of the DUT. Then a check is made to see if there is any changed portion greater than a predetermined value $T_h$ (i.e. portion of white pattern 23 or black pattern 24 in FIG. 13) in the summed data for each area. The process shown in FIG. 12 is repeated until any such a portion is not detected by stepping back the test pattern addresses. The test pattern address under which any black pattern or white pattern is not detected in the summed data of any area can be used as a last pattern address (step back ending address) in step $S_6$ of FIG. 4.

In the above description, the potential data of a DUT is compared with the corresponding potential data of a non-defect IC. However, a non-defect IC may not necessarily be used but other IC may be used. In this case, either one of the mismatch portions is considered as a defect and both of the matched portions are considered as non-defect or defect portions. The latter case, however, is rare. From this view point, the non-defect IC in this specification may mean an IC other than the DUT 11. In the process shown in FIG. 12, the power supply voltage is changed to generate a difference image. However other operational conditions such as test pattern generation frequency may be changed instead of the power supply voltage. The color indication shown in FIG. 6 can be applied to the embodiments shown in FIGS. 2, 7 and 8.

As described above, according to the present invention, the potential data of the specified portions (wiring portions) in an IC are automatically acquired for each of the test patterns and for each of the DUT and the second IC. The two potential data (of DUT and second IC) are compared for each of the test patterns and a mismatch IC portion and the corresponding test pattern address are automatically obtained. Workload and process time are remarkably reduced compared with a defect identification performed manually.

What is claimed is:

1. A method for detecting an IC defect using a charged particle beam comprising:

a first step of sequentially applying test patterns to an IC under test with the applied test pattern updated by application of a next test pattern, stopping the applied test pattern from being updated at a preset test pattern address, and irradiating a charged particle beam to a specified area of said IC under test while the test pattern stopped from being updated is being applied to detect a secondary electron emission thereby acquiring data of a first potential contrast image;

a second step of sequentially applying the test patterns to said IC under test with the applied test pattern updated by application of the next test pattern, stopping the applied test pattern from being updated at a test pattern address before one address from said preset test pattern address, and irradiating a charged particle beam to the specified area of said IC under test while the test pattern stopped from being updated is being applied to detect the secondary electron emission thereby acquiring data of a second potential contrast image;

a third step of repetitively carrying out said second step by sequentially shifting the test pattern address at which the update of the applied test pattern is stopped one address by one address before the test pattern address at which the update of the applied test pattern was stopped until said test pattern address at which the update of the applied test pattern is stopped reaches a predetermined test pattern address;

a fourth step of sequentially applying test patterns to a second IC with the applied test pattern updated by application of the next test pattern, stopping the applied test pattern from being updated at said preset zest pattern address, and irradiating a charged particle beam to a specified area of said second IC corresponding to that of said IC under test while the test pattern stopped from being updated is applying to detect the secondary election emission thereby acquiring data of a third potential contrast image;

a fifth step of sequentially applying the test patterns to said second IC with the applied test pattern updated by application of the next test pattern, stopping the applied test pattern from being updated at the test pattern address before one address from said preset test pattern address, and irradiating the charged particle beam to the specified area of said second IC while the test pattern stopped from being updated is being applied to detect the secondary electron emission thereby acquiring data of a fourth potential contrast image;

a sixth step of repetitively carrying out said fifth step by sequentially shifting the test pattern address at which the update of the applied test pattern is stopped one address by one address before the test pattern address at which the update of the applied test pattern was stopped until said test pattern address at which the update of the applied test pattern is stopped reaches said predetermined test pattern address;

a seventh step of acquiring a potential data of a specified portion in said specified area of said IC under test from the data of each of the potential contrast images of said IC under test at each of the test pattern addresses at which the update of the test pattern was stopped;

an eighth step of acquiring a potential data of a specified portion corresponding to that of said IC under test in said specified area of said second IC from each of the potential contrast image data of said second IC at each of the test pattern addresses at which the update of the test pattern was stopped;

a ninth step of converting each of the potential data acquired in said seventh step into a binary value;

a tenth step of converting each of the potential data acquired in said eighth step into a binary value; and an eleventh step of displaying in a waveform the binary value potential data for each of the test pattern addresses acquired in said ninth step and said tenth step, respectively, assuming the test pattern address as a common coordinate axis.

2. The method as recited in claim 1 wherein said preset test pattern address is a test pattern address at which a mismatch is first detected between the applied test pattern to said IC under test and a corresponding expected value.

3. The method as recited in claim 1 wherein said preset test pattern address is a test pattern address at which a mismatch is first detected between the output data from said IC under test and a corresponding expected value.

4. The method as recited in claim 1 wherein the acquisition of the potential contrast image data at each of the test pattern addresses at which the update of the applied test pattern was stopped in said first to third steps is performed under two different conditions of operation for said IC under test thereby to generate a difference between the two potential contrast image data, and the difference image data is used in said seventh step and the following steps as the potential contrast image data of said first to third steps, and wherein the acquisition of the potential contrast image data at each of the test pattern addresses at which the update of the applied test pattern was stopped in said fourth to sixth steps is performed under said two different conditions of operation for said second IC thereby to generate a difference between the two potential contrast image data, and the difference image data is used in said eighth step and the following steps as the potential contrast image data of said fourth to sixth steps.

5. The method as recited in claim 4 wherein said two conditions of operation are an application of the normal power supply voltage and an application of an abnormal power supply voltage to said IC under test or second IC.

6. The method as recited in claim 4 wherein the potential contrast image data at each of the test pattern addresses at which the update of the applied test pattern was stopped in said first to third steps is once stored for at least one specified area in a memory and then the stored potential contrast image data is used in said seventh step and the following steps as the potential contrast image data of said first to third steps, and wherein the potential contrast image data at each of the test pattern addresses at which the update of the applied test pattern was stopped in said fourth to sixth steps is once stored for at least one specified area in a memory and then the stored potential contrast image data is used in said eighth step and the following steps as the potential contrast image data of said fourth to sixth steps.

7. The method as recited in claim 4 wherein the potential contrast image data acquired in said first to third steps is displayed in image form on a monitor and said specified portions are determined by viewing the displayed image.

8. The method as recited in claim 4 wherein said specified portions are obtained from a CAD data of said IC under test on the basis of the detected defect data of said IC under test.

9. The method as recited in claim 4 wherein the potential contrast image data of said IC under test and the potential contrast image data of said second IC are converted into respective color data, and the same wiring patterns of the respective ICs are displayed side by side on a monitor using CAD data of the specified area, and at the same time the wiring portions of the specified portions of one of said wiring patterns are displayed in color by means of the converted color data of said IC under test and the wiring portions of the specified portions of the other of said wiring patterns are displayed in color by means of the converted color data of said second IC.

* * * * *